United States Patent [19]
Debolt et al.

[11] 4,068,037
[45] Jan. 10, 1978

[54] SILICON CARBIDE FILAMENTS AND METHOD

[75] Inventors: Harold E. Debolt, Andover; Thomas W. Henze, Lawrence, both of Mass.

[73] Assignee: Avco Corporation, Wilmington, Mass.

[21] Appl. No.: 646,029

[22] Filed: Jan. 2, 1976

[51] Int. Cl.² .................. B32B 9/00; D02G 3/00
[52] U.S. Cl. ..................... 428/368; 427/228; 427/249; 427/255; 428/367; 428/373; 428/375; 428/401
[58] Field of Search .......... 428/373, 367, 368, 375, 428/401; 427/248, 249, 226, 228, 255

[56] References Cited
U.S. PATENT DOCUMENTS

| 3,437,511 | 4/1969 | Hough | 428/366 |
| 3,553,003 | 1/1971 | Carlton et al. | 428/379 X |
| 3,811,920 | 5/1974 | Galasso et al. | 428/366 |
| 3,811,927 | 5/1974 | Joo et al. | 428/379 X |
| 3,850,689 | 11/1974 | Basche et al. | 428/379 X |

Primary Examiner—Lorraine T. Kendell
Attorney, Agent, or Firm—Abraham Ogman

[57] ABSTRACT

A refractory substrate, which generally is graphite or carbon is overcoated with silicon carbide by chemical vapor deposition from gaseous sources of silicon and carbon. The deposition generally takes place in combination with hydrogen and the coating on the substrate generally has a thickness at least equal to the diameter of the substrate itself. A silicon carbide filament containing an inner and outer surface layer of carbon rich silicon carbide, together with a method of making the same, is described.

6 Claims, 2 Drawing Figures

SILICON CARBIDE FILAMENTS AND METHOD

BACKGROUND OF THE INVENTION

Composite plastic and metal matrix materials reinforced with high-modulus, high-strength filaments such as boron and silicon carbide are finding increased popularity in structural applications. In particular, these types of composites are useful where high strength and stiffness with accompanying low weight is desired.

The classical silicon carbide filament contains a refractory core, generally tungsten. The core is overcoated with silicon carbide. The overcoating is accomplished by means of a hydrogen reduction chemical vapor deposition process wherein gases containing sources of silicon and carbon are decomposed and silicon carbide coats the core. The thickness of the coating is directly related to the deposition time.

The most widely-used cores are tungsten. Cores of carbonaceous nature, such as graphite and carbon monofilament are being developed as carbonaceous cores in combination with silicon carbide coatings have exhibited greater strength and stiffness than similar coatings on tungsten cores. Accordingly, the trend has been to improve the quality and manufacturing techniques for silicon carbide on carbon filaments.

Of the tests used to evaluate the quality of a silicon carbide monofilament, two—the pull test and the bend test—are most significant. In the pull test, opposite ends of a length of silicon carbide filament are clamped within the jaws of a standard tensile tester and tension is applied till the filament ruptures.

In the bend test, a length of silicon carbide filament is bent around the surface of a circular cylinder or disc. The stress at the outer surface of a filament is inversely proportional to the bending radius formed by the cylinder. The maximum surface strength is determined by the smallest diameter loop the filament can withstand without rupturing.

Standard, or non-treated, 5.6 mil silicon carbide filament on a carbon core can be bent to a minimum diameter of about 9/16th of an inch. This computes to a maximum surface strength of about 650Ksi. The pull tests, such standard silicon carbide filaments have a tensile strength of about 350Ksi.

A buffer layer of oriented graphite between the core and silicon carbide coating had no beneficial effect.

Silicon carbide filament has been shown to be sensitive to surface abrasion which lowers its tensile strength. In order to improve this surface tensile strength and lessen the sensitivity to surface abrasion, a surface layer of carbon rich silicon carbide is applied to the silicon carbide coating during the deposition process. A surface treated 5.6 mil silicon carbide filament exhibited surface tensile strength, in the bend test, to values in the range of 1,400 to 1,600Ksi. In pull tests, these filaments still exhibited strength of about 350Ksi.

While a tremendous increase in surface strength was achieved by surface treatment, surface treatment did little for pull strength.

It is an object of the invention to provide an improved silicon carbon filament which affords greater reliability of obtaining a higher tensile strength than was available from prior silicon carbide filaments.

Another object of the invention is to provide a method for economically and reliably making improved silicon carbide filament.

In accordance with the invention, there is provided a silicon carbide filament containing a carbon core overcoated with a coating of silicon carbide with an inner surface layer of carbon rich silicon carbide. The coating may also contain an outer surface layer of carbon rich silicon carbide.

The novel features that are considered characteristic of the invention are set forth in the appended claims; the invention itself, however, both as to its organization and method of operation, together with additional objects and advantages thereof, will best be understood from the following description of a specific embodiment, when read in conjunction with the accompanying drawings, in which:

It is hypothesized that silicon carbide is particularly sensitive to the presence of non-stoichiometric silicon carbide or impurities. I. T. Kendall, *Journal of Chemical Physics*, Vol. 21, pg. 821 (1953). Since both Kendall and K. Arnt & E. Hausmanne in Zeits Anorg Chem., Vol. 215, pg. 66 (1933) have found no evidence of non-stoichiometric silicon carbide, it is hypothesized that the excess carbon appears in the silicon carbide as an impurity. The properties of silicon carbide are particularly sensitive to the presence of impurities such as carbon.

DESCRIPTION OF THE INVENTION

Figure 1:
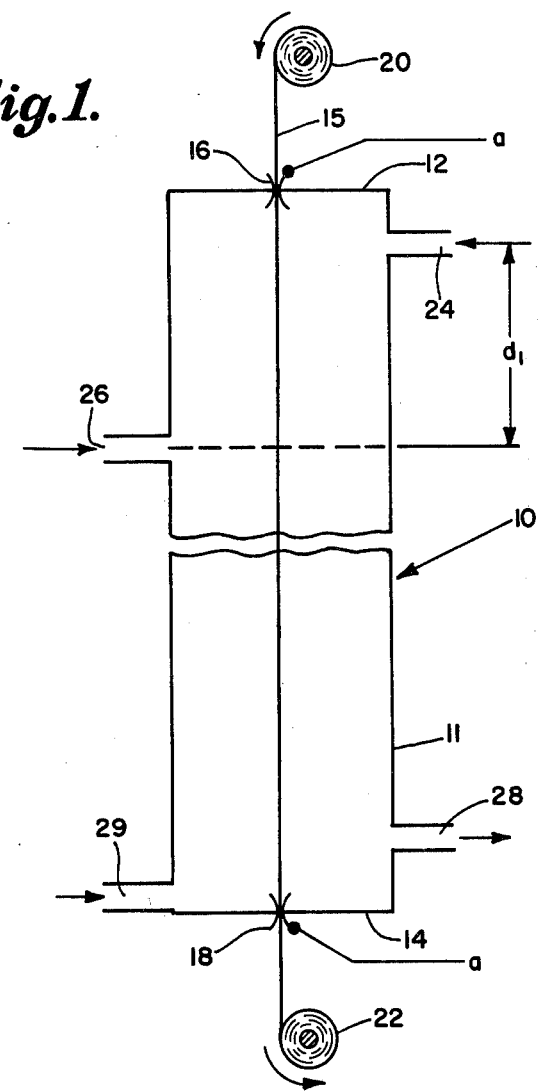
FIG. 1 is a schematic representation of a reactor for making silicon carbide filament.

FIG. 1 shows a schematic diagram 10 of a reactor for making silicon carbide filament. The reactor 10 comprises a generally closed tubular cylinder 11 containing a pair of oppositely disposed closed ends 12 and 14. A central aperture containing mercury contacts 16 and 18 are defined in each of the ends 12 and 14. The mercury contacts are coupled through terminals a—a to a source of electrical power not otherwise shown. The refractory or carbon core 15 is obtained from a supply reel 20. The core passes into the cylinder 11 through the mercury contacts 16 and out of the cylinder through the mercury contact 18 to a take-up reel 22.

A number of ports through which gas is fed to the cylinder 11 or exhausted from cylinder 11 are provided. These will be discussed in detail hereinafter.

Briefly, the carbon core 15 is raised to a deposition temperature by means of electrical resistance heating in a conventional way. Typically, a mixture of hydrogen and silanes are fed into the tubular cylinder 11. When the silanes come in contact with the heated core, a chemical vapor deposition process takes place, and silicon carbide is deposited on the core. The thickness of the silicon carbide deposited coating is a function of the deposition temperature and the time it takes for the filament to pass through the tubular cylinder 11.

Deposition temperatures in the range of 1,200°–1,500° C are used. The reactive gases comprise a blend of silanes in hydrogen. Preferred is a feedstock blend of dimethyldichlorosilane and methyldichlorosilane. The proportions in the blend vary. In fact, silicon carbide can be deposited from either silane above. Additionally, it is economically advantageous to recycle the products of the reaction that are exhausted by blending with the orginal feedstock.

The point to be made is that the invention is directed to a treatment applied to SiC coating made by chemical vapor deposition means. In short, the coating is modified.

Figure 2:
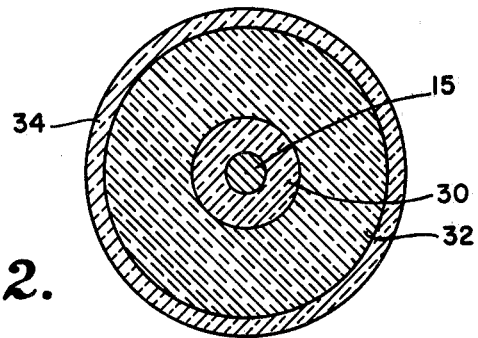
FIG. 2 is a cross-sectional representation of a silicon carbide filament embodying the principles of the present invention.

Referring to FIG. 2, the inventive concept is to construct an inner surface layer 30 of carbon rich silicon carbide at the interface of the carbon core 15 and the silicon carbide coating 32. When this is done, particularly in the manner described below, silicon carbide on carbon filament with consistent pull strengths of 600–800Ksi and bend strengths of 1,400–1,600Ksi are made at economical production rates. Silicon carbide fibers having different diameters were produced. Optimum results were achieved when the diameter of the carbon rich region was one-half of the overall diameter. A silicon carbide coating which was uniformly carbon rich was very weak and generally unsatisfactory.

The reasons for the improvement are not clear. While the outer surface layer treatment was very thin and certainly less than 0.1 mil, the inner surface layer treatment at its optimum measured 0.65 mil in thickness for a 5.6 mil filament and was useful in thicknesses of about 0.35–1.5 mils, depending on the overall diameter of the filament. Interestingly, if the entire cross-section of the silicon carbide coating is carbon rich, the filament is very weak.

In general, the thickness of the inner surface layer is 30–60% of the thickness of the silicon carbide coating.

An outer surface layer 34 was produced for the purpose of reducing sensitivity to surface abrasion. This factor does not knowingly appear pertinent at the inner surface of silicon carbide coating. The inner surface layer is constructed by combining with the silane and hydrogen feedstock a blend of argon and a hydrocarbon, the latter preferably being propane at the top of the reactor through port 24. The carbon rich silicon carbide outer surface layer 34 is produced differently.

At some distance $d_1$ below port 24, the mixture is diluted by additional hydrogen and silane and, at times, nitrogen and air through port 26. The diluted mixture is exhausted through port 28.

The deposition temperature in the region between ports 24 and 26 is higher than normally used below port 26 and is in the range of 1,400°–1,500° C for propane. This high temperature may be maintained in a number of ways. This is the primary purpose of the argon. Localized r-f heating may also be used.

Note, measurement difficulties create an uncertainty of about 100° C in all indicated temperatures.

The temperature is lowered to between 1,300° and 1,400° C below the port 26 and may decrease to about 1,200° C just above port 28. The outer surface layer 34 is produced by introducing argon and propane through port 29. The temperature at the lower end of the cylinder 11 between ports 28 and 29 is maintained in the range of 1,300°–1,400° C. Higher temperatures destroy the strength of the filament. Lower temperatures are ineffective.

Hydrocarbons are the best sources of carbon to enrich the silicon carbide. Propane and butane were very effective. While methane did not work at the bottom of the reactor because of the low temperature, it may be effective at the top. Isobutane and cyclobutane are also recommended.

Nor is the process limited to gases. Benzene, gasoline and hexane have proven useful in the past for chemical vapor deposition of carbon on heated substrates.

In short, any substances which can be pyrolitically dissociated at the deposition temperatures quoted should work.

To make silicon carbide filament pursuant to the invention, the carbon core is prepared in a conventional way and fed to the reactor 10 as indicated in FIG. 1. At the top of the reactor at port 24, silane blend, hydrogen, argon and propane are fed to the reactor in quantities to deposit on the core 15 a carbon rich silicon carbide layer. Some nitrogen and air is also added. At a distance $d_1$ below port 24, additional silane blend and hydrogen are added to dilute the mixture of gases in contact with the core 15 below the port 26.

Between the ports 24 and 26, the core 15 temperature is high and in the range of 1,400°–1,500° C. Normal deposition temperatures, in the range of 1,200°–1,350° C are maintained below port 26.

The gases are exhausted at port 28. The filament may be surface treated by adding propane and argon through port 29 with the deposition temperature in the range 1,300°–1,400° C.

The following conditions are maintained for an eight-foot-long reactor having an internal diameter of about 0.75 inches and $d_1 = 7$ inches. Core travel is 15–20 ft/min.

| GAS INTO PORT 24 | | |
|---|---|---|
| 0.65 liters/min | silane blend | $\dfrac{\text{Dimethyldichlorosilane}}{\text{Monomethyldichlorosilane}} = \dfrac{3}{1}$ |
| 0.24 liters/min | hydrogen | |
| 0.06–0.3 liters/min | Argon* | |
| 0.1 liters/min | Propane* | |
| 0.18 liters/min | Nitrogen and Air | $\dfrac{\text{Nitrogen}}{\text{Air}} = \dfrac{30}{1}$ |

*Nitrogen and air comprise 3–5% of hydrogen.
Propane and argon comprise 1–10% of (hydrogen or silane and hydrogen)

GAs INTO PORT 26
2.7 liters/min silane blend
4.8 liters/min hydrogen
.19 liter/min nitrogen and air*

GAS INTO PORT 29
0.04 liters/min
0.16 liters/min

PRODUCT

-continued

| | |
|---|---|
| Carbon core Dia | 1.3 mil |
| Silicon carbide filament Dia | 5.6 mils |
| Inner surface layer thickness | 0.65 mil |
| Outer surface layer thickness | less than 0.1 mil |
| Pull strength | 600–800Ksi |
| Bend strength | 1,400–1,600Ksi |

The argon is added primarily to raise the temperature of the core. In all probability, it may be eliminated if supplemental r-f heating is used.

It must be emphasized that the basic concept relates to the construction of a carbon rich silicon carbide inner surface layer for improving the strength of silicon carbide filaments.

The process parameters can be varies. Departures from the ratios expressed above may be compensated for by varying one or more other parameters.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims:

We claim:

1. A high-strength, high-modulus silicon carbide filament comprising a carbonaceous core, inner surface layer of carbon rich silicon carbide on said core and coating of silicon carbide on said carbon rich silicon carbide layer.

2. A high-strength, high-modulus silicon carbide filament as described in claim 1 which includes, in addition, an outer surface layer of carbon rich silicon carbide on the silicon carbide coating.

3. A high-strength, high-modulus silicon carbide filament as described in claim 1 in which said core is 1.3 mil in diameter, the inner surface layer is 0.35 to 1.5 mil thick and the silicon carbide coating is at least equal in thickness as said inner surface layer.

4. A high-strength, high-modulus silicon carbide filament as described in claim 3 which includes, in addition, an outer surface layer of carbon rich silicon carbide having a thickness of less than 0.1 mil.

5. A high-strength, high-modulus silicon carbide filament as described in claim 3 which includes, in addition, an outer surface layer of carbon rich silicon carbide having a thickness of less than 0.1 mil.

6. A high-strength, high-modulus silicon carbide filament as in claim 1 in which the thickness of the inner surface layer of silicon carbide is in the range of 30–60% of the thickness of the silicon carbide coating.

* * * * *